(12) United States Patent
Yokokawa et al.

(10) Patent No.: US 8,312,353 B2
(45) Date of Patent: Nov. 13, 2012

(54) DECODING DEVICE, DECODING METHOD, RECEIVING DEVICE, AND STORAGE MEDIUM REPRODUCING DEVICE

(75) Inventors: Takashi Yokokawa, Kanagawa (JP); Makiko Yamamoto, Tokyo (JP)

(73) Assignee: Sony Corporation, Tokyo (JP)

( * ) Notice: Subject to any disclaimer, the term of this patent is extended or adjusted under 35 U.S.C. 154(b) by 888 days.

(21) Appl. No.: 12/335,834

(22) Filed: Dec. 16, 2008

(65) Prior Publication Data

US 2009/0158128 A1 Jun. 18, 2009

(30) Foreign Application Priority Data

Dec. 18, 2007 (JP) ................................ P2007-326157

(51) Int. Cl.
*H03M 13/00* (2006.01)

(52) U.S. Cl. ........................................................ 714/780

(58) Field of Classification Search .................... None
See application file for complete search history.

(56) References Cited

U.S. PATENT DOCUMENTS

| 5,107,503 | A | * | 4/1992 | Riggle et al. ................... 714/784 |
| 5,901,158 | A | * | 5/1999 | Weng et al. .................... 714/785 |
| 5,996,105 | A | * | 11/1999 | Zook .............................. 714/755 |
| 7,689,888 | B2 | * | 3/2010 | Kan et al. ....................... 714/758 |
| 7,716,561 | B2 | * | 5/2010 | Belogolovyi et al. .......... 714/780 |
| 8,015,499 | B2 | * | 9/2011 | Kanaoka ........................ 715/780 |
| 8,028,214 | B2 | * | 9/2011 | Sugitani et al. ................ 714/752 |
| 8,103,945 | B2 | * | 1/2012 | Yamamoto et al. ............ 714/800 |

* cited by examiner

*Primary Examiner* — Amine Riad

(74) *Attorney, Agent, or Firm* — Frommer Lawrence & Haug LLP; William S. Frommer; Ellen Marcie Emas

(57) ABSTRACT

A decoding device for a linear code on a ring R, the decoding device including: a plurality of storage media; and a processing section; wherein the processing section uses a part of reliability of all symbols at a previous time to update reliability of each symbol in a process of iterative decoding for increasing the reliability of each symbol, and further retains a part used to update retained reliability information and a part unused to update the retained reliability information on two separate storage media.

22 Claims, 6 Drawing Sheets

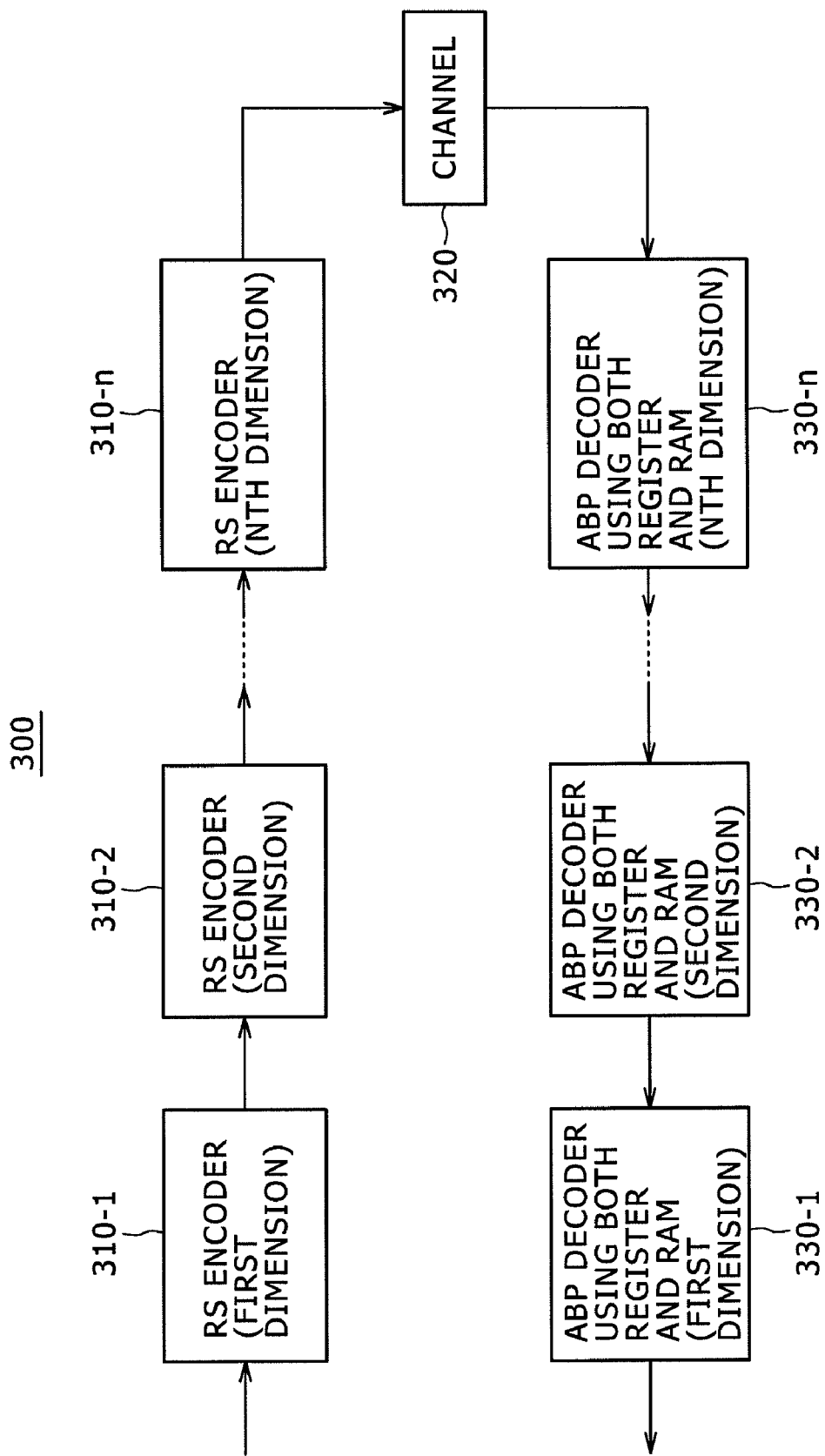

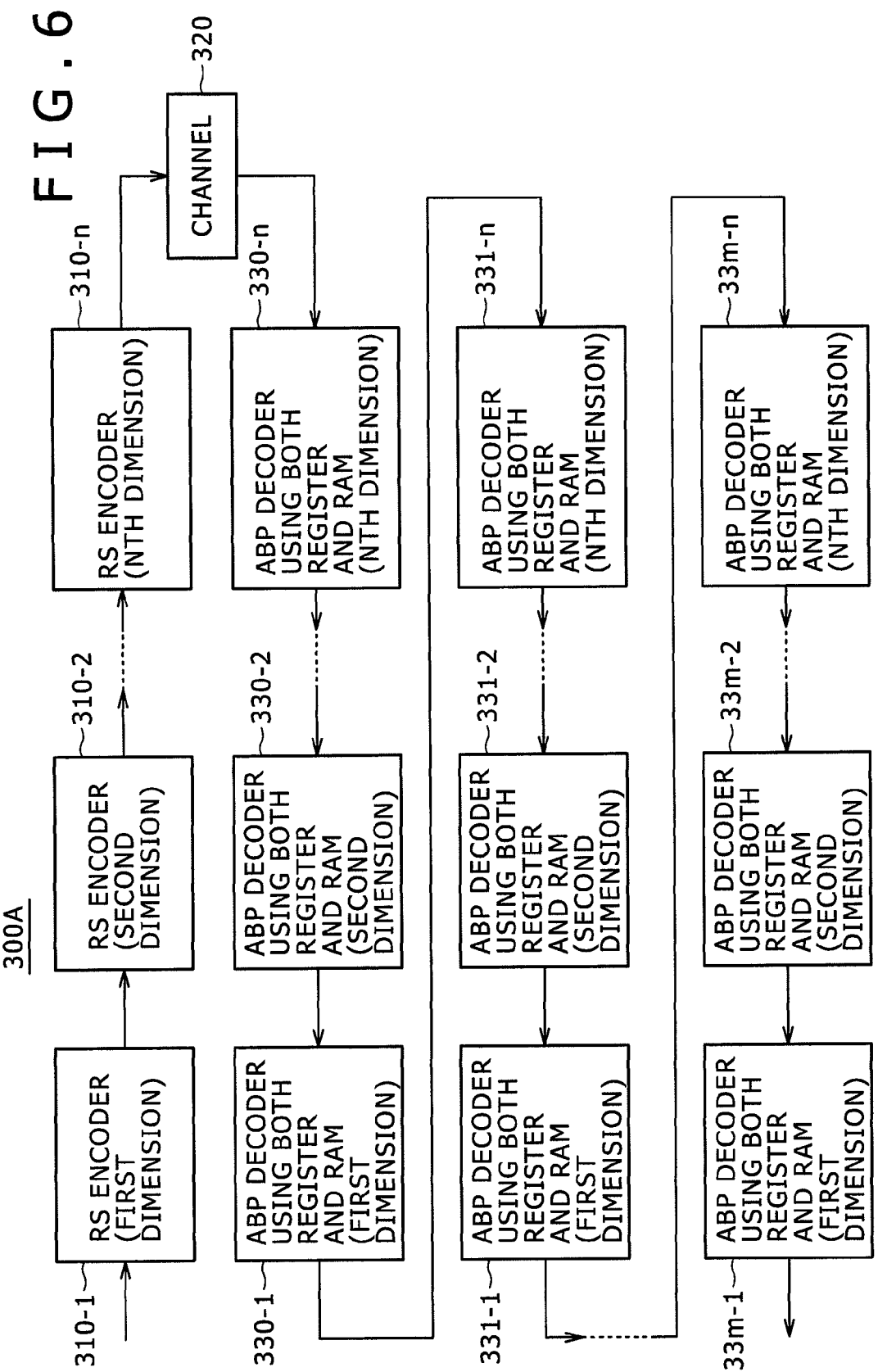

DECODING DEVICE, DECODING METHOD, RECEIVING DEVICE, AND STORAGE MEDIUM REPRODUCING DEVICE

CROSS REFERENCES TO RELATED APPLICATIONS

The present invention contains subject matter related to Japanese Patent Application JP 2007-326157 filed in the Japan Patent Office on Dec. 18, 2007, the entire contents of which being incorporated herein by reference.

BACKGROUND OF THE INVENTION

1. Field of the Invention

The present invention relates to a decoding device, a decoding method, a receiving device, and a storage medium reproducing device applied to for example a circuit for implementing error correcting code technology using an algebraic method and a program storage medium.

2. Description of the Related Art

A decoding method is known which utilizes algebraic properties of algebraic geometry codes, for example a Reed-Solomon code and a BCH (Bose-Chaudhuri-Hocquenghem) code, which is a subfield subcode of the Reed-Solomon code, and which method is excellent in terms of both performance and calculation cost.

For example, supposing that a Reed Solomon code having a code length n, an information length k, a definition body $GF(q)$ ($q=p^m$, p: prime number), and a minimum distance $d=n-k$ is $RS(n, k)$, minimum distance decoding (normal decoding) that decodes a hard decision received word into a codeword having a minimum Hamming distance is well known as a method ensuring correction of t error symbols satisfying $t<d/2$.

In addition, Guruswami-Sudan list decoding (hereinafter referred to as G-S list decoding) ensures correction of t error symbols satisfying $t<\sqrt{nk}$ (see V. Guruswami, M. Sudan, "Improved Decoding of Reed-Solomon and Algebraic-Geometry Codes," IEEE Transactions on Information Theory, Vol. 45, pp. 1757-1767, 1999).

It is known that Koetter-Vardy list decoding (hereinafter referred to as K-V list decoding) using a soft decision received word as an extended version of the Guruswami-Sudan list decoding includes, as with the Guruswami-Sudan list decoding, four procedures of: (1) calculating the reliability of each symbol from received information; (2) extracting two-variable polynomial interpolation conditions from the reliability; (3) interpolating a two-variable polynomial; and (4) creating a decoded word list by factorization of the interpolation polynomial. It is known that the K-V list decoding has a higher performance than hard decision decoding (see R. Koetter, A. Vardy, "Algebraic Soft-Decision Decoding of Reed-Solomon Codes," IEEE Transactions on Information Theory, 2001).

It is also known that re-encoding can reduce calculation cost thereof to a practical range (see R. Koetter, J. Ma, A. Vardy, A. Ahmed, "Efficient Interpolation and Factorization in Algebraic Soft-Decision Decoding of Reed-Solomon Codes," Proceedings of ISIT 2003).

On the other hand, a low density parity check code (LDPC code) that enables a high performance close to a limit performance to be obtained by iterative decoding using belief propagation (BP) has recently been drawing attention as a linear code (see D. MacKay, "Good Error-Correcting Codes Based on Very Sparse Matrices," IEEE Transactions on Information Theory, 1999).

It is theoretically known that the belief propagation (BP) used for the LDPC code is generally effective only for linear codes having a low density parity check matrix. It is also known that lowering the density of the parity check matrix of a Reed-Solomon code or a BCH code is NP-hard (Nondeterministic Polynomial-time hard) (see Berlekamp, R. McEliece, H. van Tilborg, "On the Inherent Intractability of Certain Coding Problems," IEEE Transactions on Information Theory, vol. 24, pp. 384-386, May 1978).

Thus, it has been considered to be difficult to apply belief propagation to Reed-Solomon codes or BCH codes.

In 2004, however, Narayanan et al. introduced an effective application of belief propagation (BP) to Reed-Solomon codes, BCH codes, and other linear codes having a parity check matrix whose density is not low, using a parity check matrix diagonalized according to the reliability of a received word (see Jing Jiang, K. R. Narayanan, "Soft Decision Decoding of RS Codes Using Adaptive Parity Check Matrices," Proceedings of IEEE International Symposium on Information Theory 2004).

This method is referred to as adaptive belief propagation (ABP) decoding. This ABP decoding method will be described in the following.

For example, consideration will be given to a linear code C that has a code length n=6, an information length k=3, and a coding ratio r=1/2, and which has the following 3×6 matrix H as a parity check matrix.

$$H = \begin{pmatrix} 1 & 0 & 1 & 0 & 0 & 1 \\ 1 & 1 & 0 & 1 & 0 & 1 \\ 0 & 1 & 1 & 1 & 1 & 1 \end{pmatrix}$$

A code space C is expressed as follows.

$$C=\{c=(c_1,c_2,\ldots,c_6), c_1,c_2,\ldots,c_6 \in 0,1 | H \cdot c^t = 0\}$$

Suppose that a certain codeword passes through a certain channel, for example a BPSK (Binary Phase Shift Keying) modulation+AWGN (Additive While Gaussian Noise) channel, and is thereafter received as the following received word by a receiver.

$$r=(r_1,r_2,\ldots,r_6)=(0.4, 1.2, 0.1, 0.7, 0.3, 0.7)$$

At this time, the magnitude of the absolute value of each received value indicates the height of the reliability of the received word. That is, numbers are set to the received values in increasing order of reliability as follows.

$$<3><6><1><4><2><4>$$

$$r=(0.4, 1.2, 0.1, 0.7, 0.3, 0.7)$$

Next, the diagonalization of the parity check matrix H is performed in order starting with a column corresponding to the symbol whose reliability is lowest. In this example, columns corresponding to the symbols of increasing reliability are a third column, a fifth column, a first column, a fourth or sixth column, and a second column in this order. The diagonalization of the parity check matrix H is performed in this order of priority.

<1> Basic Transformation with Third Column as Key $$H = \begin{pmatrix} 1 & 0 & ① & 0 & 0 & 1 \\ 1 & 1 & 0 & 1 & 0 & 1 \\ 1 & 1 & 0 & 1 & 1 & 0 \end{pmatrix}$$

<2> Basic Transformation with Fifth Column as Key $$H = \begin{pmatrix} 1 & 0 & ① & 0 & 0 & 1 \\ 1 & 1 & 0 & 1 & ① & 0 \\ 1 & 1 & 0 & 1 & 0 & 1 \end{pmatrix}$$

<3> Basic Transformation with First Column as Key $$H_{new} = \begin{pmatrix} 0 & 1 & ① & 1 & 0 & 0 \\ 0 & 0 & 0 & 0 & ① & 1 \\ ① & 1 & 0 & 1 & 0 & 1 \end{pmatrix}$$

When a column on which diagonalization is attempted is linearly dependent to a column which has previously been diagonalized, the column on which diagonalization is attempted is left as it is, and diagonalization is attempted on a next column in the order.

A parity check matrix Hnew obtained as a result of thus performing diagonalization a number of times equal to the number of ranks of the matrix H is used to update reliability by belief propagation (BP).

FIG. 1 is a Tanner graph corresponding to a parity check matrix Hnew.

Belief propagation is implemented by allowing a message, that is, an LLR (Log Likelihood Ratio) to come and go along an edge of the Tanner graph.

Specifically, when transmission and reception is performed between additive Gaussian noise channels with BPSK modulation, the LLR Ri of each bit is given by the following equation:

$$R_i = (2/\sigma) \cdot r_i$$

where $\sigma$ is the variance of Gaussian noise, and $r_i$ denotes a received value.

A node corresponding to each column of the matrix is referred to as a variable node, and a node corresponding to each row of the matrix is referred to as a check node.

Letting $Q_{i,j}$ be a message from an ith variable node to a jth check node, and $R_{i,j}$ be a message from the jth check node to the ith variable node, and letting J(i) be an index set of check nodes connected to the ith variable node, and I(j) be an index set of variable nodes connected to the jth check node, respective updating equations of the message $R_{i,j}$ and the message $Q_{i,j}$ are as follows:

$$R_{i,j} = \prod_{l \in I(j) \setminus i} \text{sign}(Q_{l,j}) \cdot f\left( \sum_{l \in I(j) \setminus i} f(|Q_{l,j}|) \right)$$

$$Q_{i,j} = R_i + \theta \cdot \sum_{l \in J(i) \setminus j} R_{i,l}$$

where $\theta$ is a coefficient referred to as a vertical step damping factor, and satisfies a condition $0 < \theta \leq 1$. Further, $f(X) = \ln\{(\exp(x)+1)/(\exp(x)-1)\}$.

rj is set as an initial value of the message $Q_{i,j}$, and extrinsic information $\Lambda_i^x$ is updated by the following equation:

$$\Lambda_i^x = \sum_{l \in J(i)} R_{i,l}$$

Further, the LLR $\Lambda_i^q$ of each code bit is updated by the following equation:

$$\Lambda_i^q = r_i + \alpha_1 \Lambda_i^x$$

where $\alpha 1$ is a coefficient referred to as an adaptive belief propagation damping factor, and satisfies a condition $0 < \alpha 1 \leq 1$.

The updating of the LLR by the belief propagation (BP) is repeated until an iterative decoding stopping condition prepared in advance is satisfied, for example until a maximum iteration number $It_H$ is reached.

Using the reliability of the LLR updated by the belief propagation (BP), that is, using the magnitude of the absolute value of the LLR as reliability, columns are diagonalized in increasing order of reliability of the corresponding symbols, whereby iterative decoding by new belief propagation (BP) can be performed.

This will be referred to as inner iterative decoding. The updating of the LLR is repeated until an inner iterative decoding stopping condition SC1 prepared in advance is satisfied.

Further, a plurality of orders other than the order of reliability of received values are prepared as initial value of order of priority in diagonalization of the columns of the parity check matrix. The inner iterative decoding is repeatedly performed serially or in parallel using the plurality of orders.

This will be referred to as outer iterative decoding. The LLR update is repeated until an outer iterative decoding stopping condition SC2 prepared in advance is satisfied.

A decoder performs decoding with the LLR updated repeatedly by the above-described ABP (Adaptive Belief Propagation) procedure as an input.

Now, when a target linear code is a Reed-Solomon code, the following are considered as the iterative decoding stopping conditions SC1 and SC2, for example.

(A) H·d==0 or Iteration Number $t \geq N$ (B) Success in Bounded Distance Decoding or Iteration Number $t \geq N$ (C) Success in Koetter-Vardy Soft Decision List Decoding or Iteration Number $t \geq N$ where $d = (d_1, d_2, \ldots, d_6)$ is a hard decision result of $\Lambda_i$, $d_i = \{1 \text{ when } \Lambda_i^q > 0, \text{ and } 0 \text{ when } \Lambda_i^q \leq 0\}$, and N is a maximum number of iterations determined in advance.

In addition, the following are considered as decoding methods.

(a) Hard Decision Decoding
(b) Bounded Distance Decoding
(c) Koetter-Vardy Soft Decision List Decoding In addition, for belief propagation (BP), an approximation method at a time of check node message calculation referred to as a UMP (Uniformly Most Powerful) decoding method is known (see M. P. C. Fossorier, M. Mihaljevic, H. Imai, "Reduced Complexity Iterative Decoding of Low-Density Parity Check Codes Based on Belief Propagation," IEEE Transactions on Communications, Vol. 47, No. 5, May 1999).

The calculation equation is shown below.

$$R_{i,j} = \prod_{l \in I(j) \setminus i} \text{sign}(Q_{l,j}) \cdot \min_{l \in I(j) \setminus i} |Q_{l,j}|$$

The use of the UMP decoding method reduces an amount of calculation because a complex calculation of an f-function is replaced with a minimum value search, but may result in degradation in performance due to approximation.

In addition, UMP decoding is realized by only a minimum value search for a message at a check node and adding a message at a variable node. Therefore, when transmission and reception is performed with BPSK modulation on an additive Gaussian noise channel, belief propagation (BP) is made possible by using a received value ri as an LLR even without channel information σ.

SUMMARY OF THE INVENTION

As for implementation of a decoder of ordinary LCPC codes, a few parallel decoding implementing methods are known which utilize the structure of a quasi-cyclic code when the quasi-cyclic code is assumed.

On the other hand, various difficulties occur when adaptation of the methods to the ABP decoding method is attempted. For example, efficient parallel implementation is impossible because a parity check matrix obtained in an ABP decoding process is not quasi-cyclic. In addition, because the same matrix is not of low density except for a diagonal part, an amount of calculation for a message update at each node becomes enormous. Further, an amount of memory for retaining each message is also enormous.

A decoder using existing ABP needs to read many pieces of reliability information at once at a time of updating each check node message in order to achieve a practical throughput even when a code being handled is not of low density. For this, the reliability information needs to be retained by a register.

However, when all the reliability information is retained by a register, there is a fear of an enormous memory area at a time of implementation.

On the other hand, when a same amount of information is stored in a semiconductor memory, for example a RAM (Random Access Memory), a far smaller memory can be implemented as compared with the implementation of a register formed by a flip-flop or the like. However, because an amount of data extracted at a time is limited to one word, the semiconductor memory is not suitable for the above-described purpose.

It is desirable to provide a decoding device, a decoding method, a receiving device, and a storage medium reproducing device that make it possible to reduce a circuit scale.

According to a first embodiment of the present invention, there is provided a decoding device for a linear code on a ring R, the decoding device including: a plurality of storage media; and a processing section; wherein the processing section uses a part of reliability of all symbols at a previous time to update reliability of each symbol in a process of iterative decoding for increasing the reliability of each symbol, and further retains a part used to update retained reliability information and a part unused to update the retained reliability information on two separate storage media.

Preferably, the processing section uses belief propagation (BP) as the iterative decoding, and further uses approximation by a UMP (Uniformly Most Powerful) decoding method at a time of a reliability update.

Preferably, the processing section obtains reliability of a received word, determines order of priority in diagonalizing a parity check matrix on a basis of the obtained reliability, diagonalizes the parity check matrix on a basis of the determined order of priority, and updates the reliability of the received word by performing belief propagation (BP) one or a plurality of times using a resulting parity check matrix.

Preferably, the plurality of storage media include a register and a semiconductor memory, and the processing section retains the part used to update the reliability in the register, and retains the part unused to update the reliability in the semiconductor memory.

Preferably, one of an algebraic geometry code on a finite field and an isomorphic code of the algebraic geometry code is used as a linear code.

Preferably, one of a Reed-Solomon code, a BCH code, and isomorphic codes of the Reed-Solomon code and the BCH code is used as an algebraic geometry code, and bounded distance decoding is performed in a subsequent stage with reliability obtained by a plurality of updates as an input received word.

Preferably, one of a Reed-Solomon code, a BCH code, and isomorphic codes of the Reed-Solomon code and the BCH code is used as an algebraic geometry code, and hard decision list decoding by a predetermined algorithm is performed with reliability obtained by a plurality of updates as an input received word.

Preferably, one of a Reed-Solomon code, a BCH code, and isomorphic codes of the Reed-Solomon code and the BCH code is used as an algebraic geometry code, and multiplicity setting and soft decision list decoding by a predetermined algorithm is performed with reliability obtained by a plurality of updates as an input received word.

According to a second embodiment of the present invention, there is provided a decoding method for a linear code on a ring R, wherein a part of reliability of all symbols at a previous time is used to update reliability of each symbol in a process of iterative decoding for increasing the reliability of each symbol, and further a part used to update retained reliability information and a part unused to update the retained reliability information are retained on two separate storage media.

According to a third embodiment of the present invention, there is provided a receiving device for receiving a signal transmitted from a device formed by connecting one of an RS (Reed-Solomon) encoder and a BCH encoder to a convolutional encoder, the receiving device including a decoding device using a reliability update and a decoding method as described above.

According to a fourth embodiment of the present invention, there is provided a receiving device for receiving a signal transmitted from a device formed by connecting one of an RS encoder and a BCH encoder to a convolutional encoder, the receiving device including an iterative decoding device using a reliability update and a decoding method as described above.

According to a fifth embodiment of the present invention, there is provided a storage medium reproducing device for a signal resulting from n-dimensional product coding using one of an RS code and a BCH code, the storage medium reproducing device including a decoding device using a reliability update and a decoding method as described above.

Preferably, there is provided a storage medium reproducing device for a signal resulting from n-dimensional product coding using one of an RS code and a BCH code, the storage medium reproducing device including an iterative decoding device using a reliability update and a decoding method as described above.

According to the embodiments of the present invention, implementation can be achieved on a small circuit scale by retaining the part used to update the reliability in the register and retaining the part unused to update the reliability in the semiconductor memory.

According to the embodiments of the present invention, a circuit scale can be reduced.

BRIEF DESCRIPTION OF THE DRAWINGS

FIG. 5 is a diagram showing an example of configuration of a digital storage medium reproducer according to a fourth embodiment adopting an ABP decoder using both a register and a RAM; and FIG. 6 is a diagram showing an example of configuration of a digital storage medium reproducer according to a fifth embodiment adopting an ABP decoder using both a register and a RAM.

DETAILED DESCRIPTION OF THE PREFERRED EMBODIMENTS

Preferred embodiments of the present invention will hereinafter be described with reference to the drawings.

A decoding device according to an embodiment of the present invention is applicable to a circuit for implementing error correcting code technology using an algebraic method, for example an adaptive belief propagation (ABP) decoder.

ABP decoding is a decoding method for Reed-Solomon (RS) codes, BCH codes, and other linear codes having a parity check matrix whose density is not low. When receiving a codeword from a transmission line, ABP decoding updates the received word to a more reliable value.

In the present embodiment, the updating of reliability of the received value by belief propagation (BP) is implemented by an update based on an approximate value using UMP (Uniformly Most Powerful) decoding.

The ABP decoder according to the present embodiment uses a part of the reliability of all symbols at a previous time to update the reliability of each symbol in a process of iterative decoding for increasing the reliability of each symbol, and further retains a part used to update retained reliability information and a part not used to update the retained reliability information on two separate storage media, specifically a register formed by a flip-flop or the like and a semiconductor memory, for example a RAM.

In the present embodiment, the part used for the reliability update is retained in the register, and the part not used for the reliability update is retained in the RAM.

In addition, the ABP decoder according to the present embodiment obtains the reliability of a received word, determines the order of priority in diagonalization of a parity check matrix on the basis of the obtained reliability, diagonalizes the parity check matrix on the basis of the determined order of priority, and updates the reliability of the received word by performing belief propagation (BP) one or a plurality of times using the resulting parity check matrix.

Description in the following will be made of a concrete example of a constitution and functions of an ABP decoder as a first embodiment of the present invention.

<First Embodiment>

Figure 1:
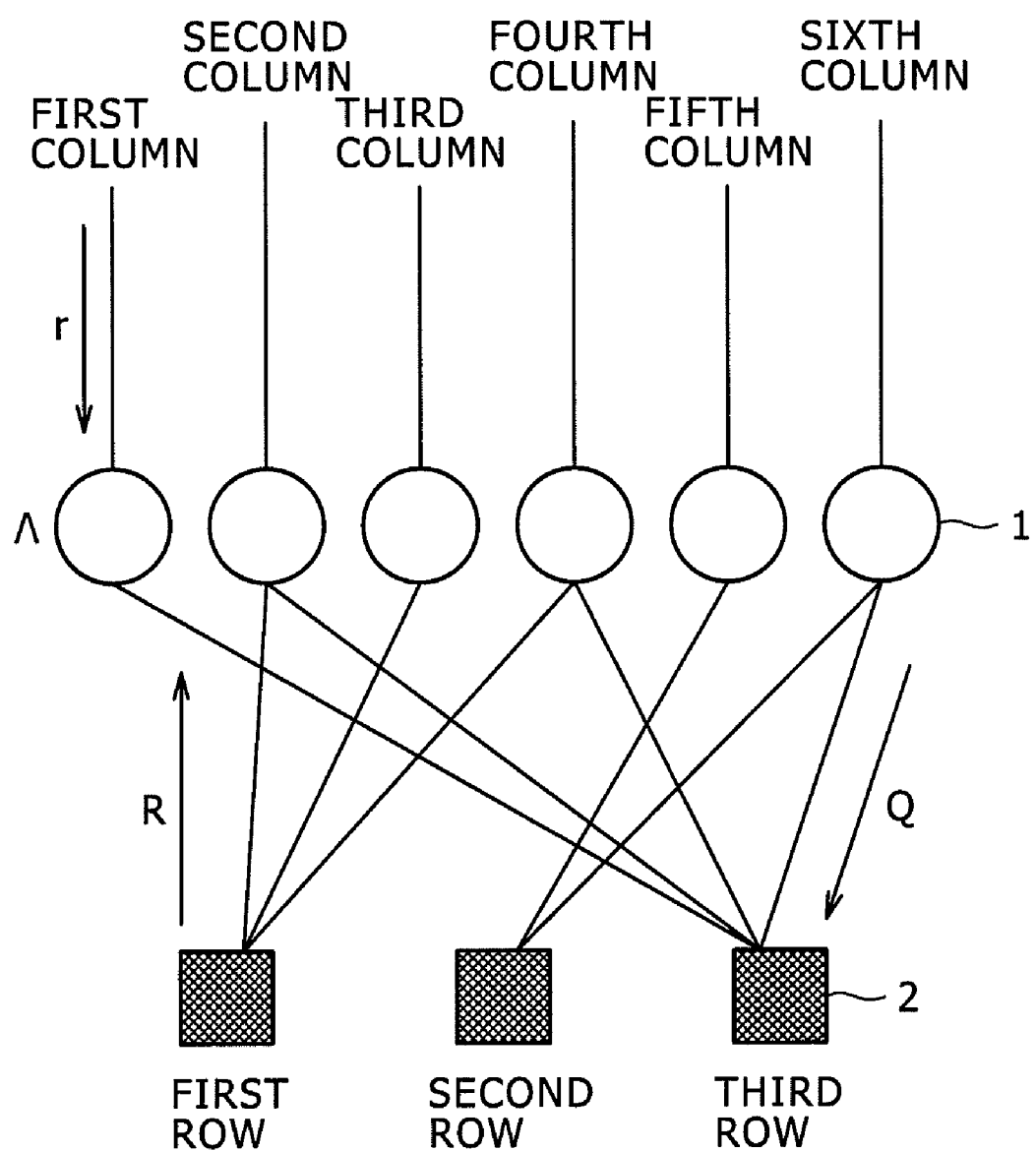
FIG. 1 is a Tanner graph corresponding to a parity check matrix Hnew.
Figure 2:
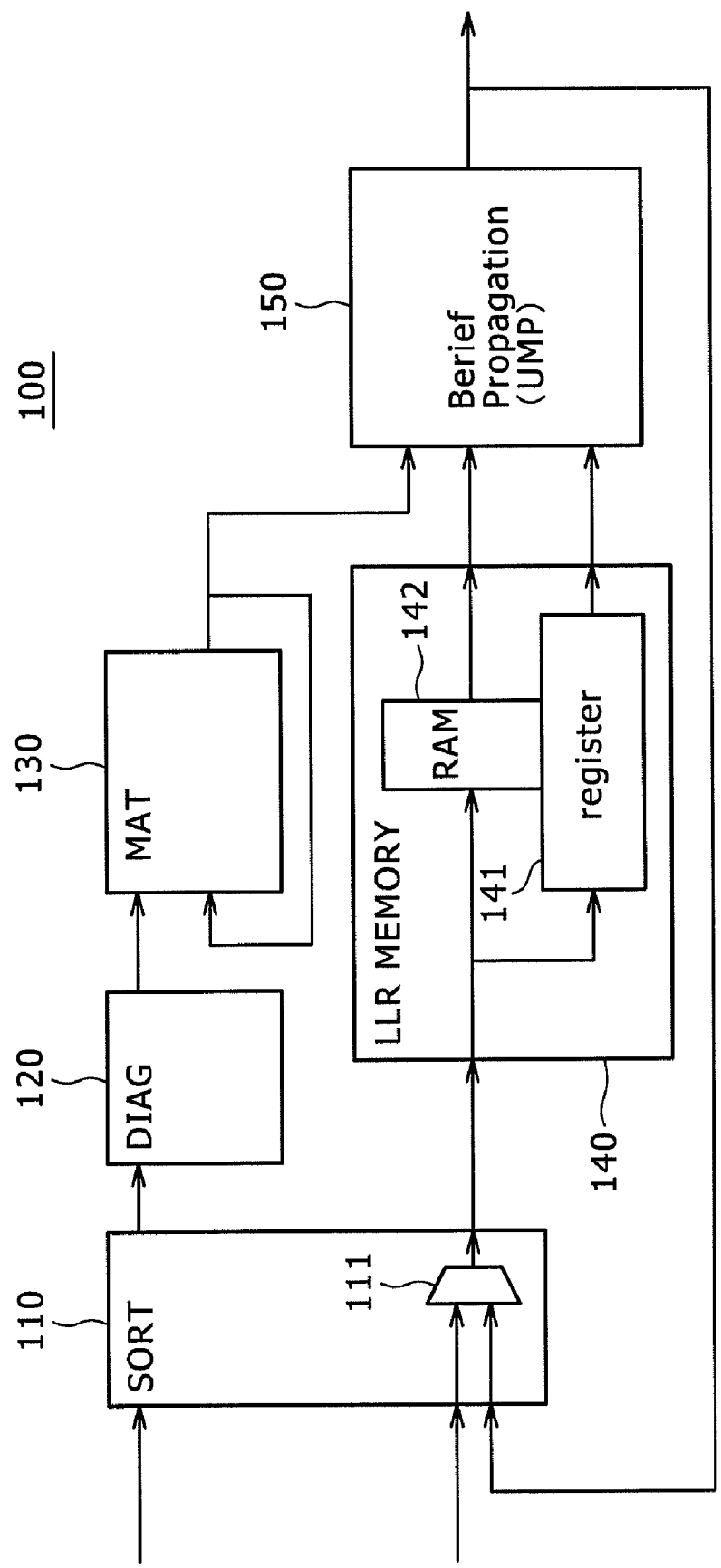
FIG. 2 is a block diagram showing an example of configuration of an ABP decoder (decoding device) according to an embodiment of the present invention.

FIG. 2 is a block diagram showing an example of configuration of an ABP decoder (decoding device) according to an embodiment of the present invention.

As shown in FIG. 2, the ABP decoder includes a sort circuit (SORT) 110, a diagonalizing circuit (DIAG) 120, a matrix storing memory (MAT) 130, an LLR storing memory 140, and a UMP decoder 150.

Incidentally, a processing section according to an embodiment of the present invention is formed by the sort circuit (SORT) 110, the diagonalizing circuit (DIAG) 120, the matrix storing memory (MAT) 130, the LLR storing memory 140, and the UMP decoder 150.

The sort circuit 110 has a selector 111. The LLR storing memory 140 has a register 141 and a RAM 142.

A bucket sort, an inverse mapping sort, a bitonic sort or the like can be used as a sort algorithm of the sort circuit 110.

A circuit that performs a Gauss elimination method serially or in parallel can be used as the diagonalizing circuit 120.

Further, by adjusting a damping factor $\alpha 1$ used at a time of check node operation of UMP decoding, LLR information stored in the register 141 can be two bits, of which one bit is a code and one bit is the magnitude of reliability, and a reliability minimum value search can be implemented by only an AND gate.

In addition, an updated LLR may be more or less than an amount of 128 bits.

In this case, consideration will be given to $F_2 8$ as a finite field and a (204, 188) Reed-Solomon code as a linear code c.

A generator polynomial is the following equation.

$$g(x) = \Pi_{i=0}^{15}(x - \alpha^{i+b})$$

An information word is $f = (f_0, f_1, f_2, \ldots f_{187})$. A corresponding information polynomial is the following equation.

$$f(x) = f_0 + f_1 x + f_2 x^2 + \ldots + f_{187} x^{187}$$

Then, a code polynomial corresponding to a codeword $c = (c_0, c_1, c_2, \ldots, c_{203})$ by systematic coding is given by the following equation.

$$c(x) = c_0 + c_1 x + c_2 x^2 + \ldots + c_{203} x^{203}$$
$$\simeq q(x)f(x) \mod (x^{255} - 1)$$
$$= f(x)x^{16} + p(x) \mod (x^{255} - 1)$$

(where $q(x)$ and $p(x)$ are respectively a quotient and a remainder when $f(x)x^{16}$ is divided by $g(x)$)

The codeword c is subjected to bit expansion, thereafter subjected to BPSK modulation, and then transmitted and received between additive Gaussian noise transmission lines.

Because one symbol of the (204, 188) Reed-Solomon code is 8 bits, information of 204 symbols is expanded into 8 bits for each symbol, and is BPSK-modulated as information of a total of 1632 bits. Suppose that a received word corresponding to the bit expansion of the codeword c is $d=(d_0, d_1, d_2, \ldots, d_{1631})$.

In the present embodiment, this received word is subjected to ABP decoding using approximation of UMP decoding.

First, the 1632 received values obtained in the sort circuit 110 are sorted in order of reliability of the 1632 received values, that is, magnitude of absolute values of the 1632 received values. Because UMP decoding is performed, it is not necessary to calculate an LLR using transmission line information in this case.

Second, the diagonalizing circuit 120 diagonalizes a column of a parity check matrix corresponding to 128 bits of high reliability.

Third, using the diagonalized parity check matrix, UMP belief propagation (BP) decoding is performed. In order to achieve practical implementation, and because the lower the reliability of bits, the greater the necessity of LLR updating of the bits by iterative decoding, suppose that LLR updating is performed on only the diagonalized 128 bits of the 1632 bits.

In addition, suppose that an ABP damping factor $\alpha 1$ used to calculate a check node message is one divided by a power of two, for example $\alpha 1 = 1/8$, and that the multiplication of the ABP damping factor $\alpha 1$ is implemented by a bit shift. When the number $It_H$ of times of iterative decoding corresponding to one change in the matrix is one, a calculation necessary for the LLR updating of each bit is as follows.

$$\Lambda_i^q = r_i + \prod_{l \in I(j) \setminus i} \text{sign}(r_l) \cdot \min_{l \in I(j) \setminus i} |r_l|$$

In this case, suppose that one is set in only a jth row in an ith column as a result of the diagonalization of the parity check matrix.

Because a set I(j) of indexes of variable nodes connected to each check node is changed each time diagonalization is performed, and because about half of all the indexes are members of the set I(j), almost all LLR information is necessary to update reliability of each bit, and these LLRs need to be retained in memory.

Further, to achieve a practical throughput, a large number of clocks cannot be spent for one check node message update.

For example, supposing that a check node message is updated with one clock, a message having the members of the set I(j) as indexes is extracted at a time, a minimum value search is performed, and a part other than three low-order bits of the obtained minimum value, for example two high-order bits of the minimum value when the message is expressed by a total of five bits, is added to a received value, whereby ABP decoding is achieved.

In this case, of the five bits of reliability of each bit, the two high-order bits are stored in the register, and the three low-order bits are stored in the RAM 142. Then, the two high-order LLR bits of all the bits that can be necessary for the LLR updating of each bit can be accessed simultaneously with each clock, and the three low-order bits necessary only at a time of updating the bit itself can be accessed from the RAM 142 for each LLR per clock.

At this time, the three low-order bits are used for an LLR update together with the two high-order bits stored in the register and accessible at any time.

The above-described method achieves UMP decoding that can update one LLR with one clock, and greatly reduces a circuit scale by partially using the RAM 142 as compared with a case of storing all information in a register.

Incidentally, a Reed-Solomon code, a BCH code, or an isomorphic code of a Reed-Solomon code or a BCH code can be used as an algebraic geometry code, and bounded distance decoding can be performed in a subsequent stage with reliability obtained by a plurality of updates as an input received word.

Alternatively, a Reed-Solomon code, a BCH code, or an isomorphic code of a Reed-Solomon code or a BCH code can be used as an algebraic geometry code, and hard decision list decoding by a Sudan algorithm, a Guruswami-Sudan algorithm, or another algorithm can be performed with reliability obtained by a plurality of updates as an input received word.

Alternatively, a Reed-Solomon code, a BCH code, or an isomorphic code of a Reed-Solomon code or a BCH code can be used as an algebraic geometry code, and multiplicity setting and soft decision list decoding by a Koetter-Vardy algorithm, an ElKhamy-McEliece algorithm, or another algorithm can be performed with reliability obtained by a plurality of updates as an input received word.

In addition, a system as a whole can be used as an ABP decoder of a structure having a plurality of ABP decoders of FIG. 2 and increasing throughput by using the ABP decoders in parallel.

Various devices (receiving devices and storage medium reproducing devices) that can adopt the ABP decoder according to the first embodiment will be described below as a second to a sixth embodiment.

<Second Embodiment>

Figure 3:
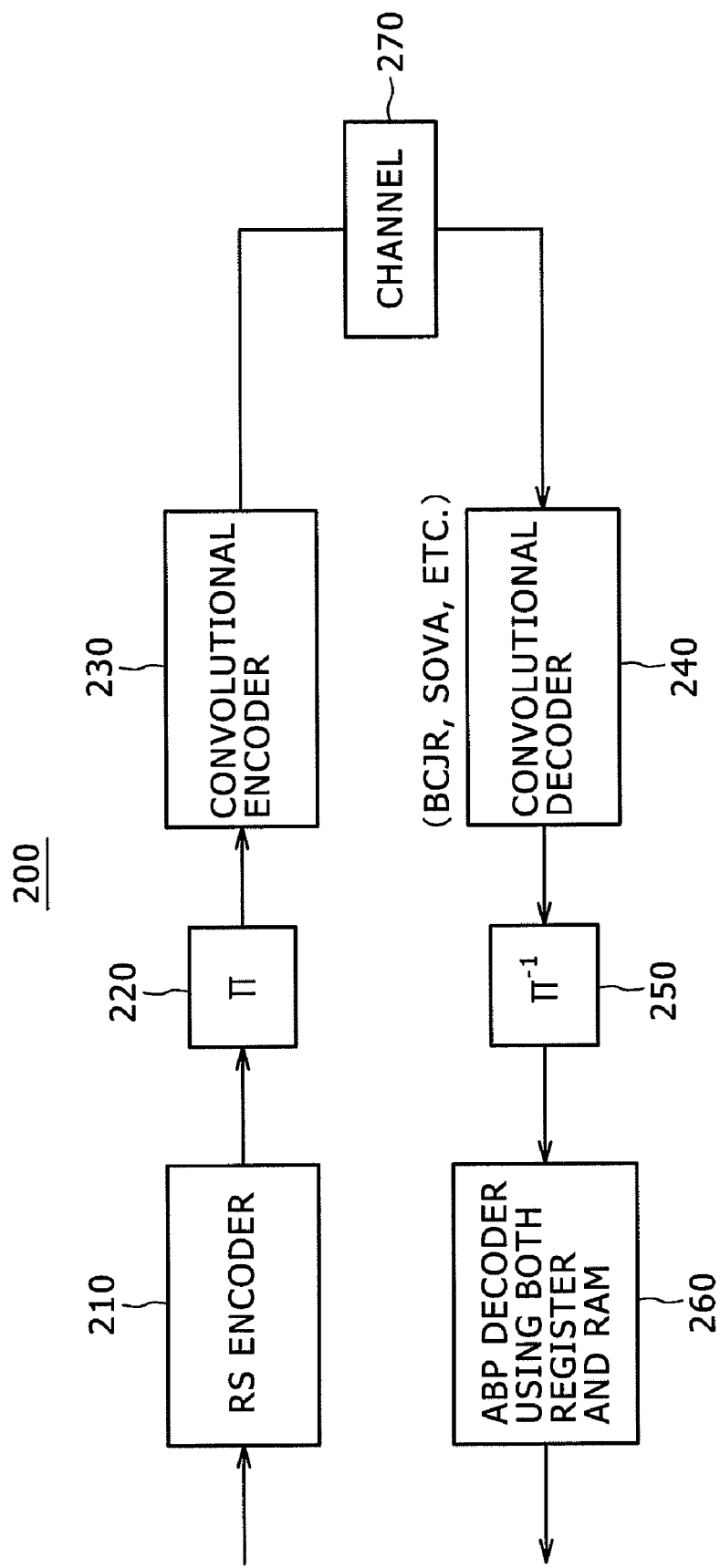
FIG. 3 is a diagram showing an example of configuration of a communication system according to a second embodiment in which an ABP decoder is used in an error correcting system of a digital signal receiver such for example as a digital television set.

FIG. 3 is a diagram showing an example of configuration of a communication system according to a second embodiment in which the ABP decoder is used in an error correcting system of a digital signal receiver (receiving device) such for example as a digital television set.

As shown in FIG. 3, the communication system 200 includes an RS encoder 210, an interleaver 220, a convolutional encoder 230, a convolutional code soft output decoder 240, a deinterleaver 250, an ABP decoder 260 using both an RS code register and a RAM, and a channel 270.

The communication system 200 having the register according to the second embodiment adopts the ABP decoder that also uses the RAM, so that a circuit scale is greatly reduced.

The communication system 200 subjects an RS-encoded and convolutional-coded transmitted word to convolutional code soft output decoding, and then subjects the transmitted word to ABP decoding in the ABP decoder 260 using both the register and the RAM.

The convolutional code soft output decoding in this case refers to decoding by for example a BCJR (Bahl-Cocke-Jelinek-Raviv) algorithm or SOVA (Soft Output Viterbi Algorithm).

After updating reliability by ABP, the ABP decoder 260 using both the register and the RAM performs bounded distance decoding after hard decision, list decoding, or soft decision list decoding with a soft value as an input as it is.

The communication system 200 having the register according to the second embodiment adopts the ABP decoder that also uses the RAM, so that a circuit scale is greatly reduced.

<Third Embodiment>

Figure 4:
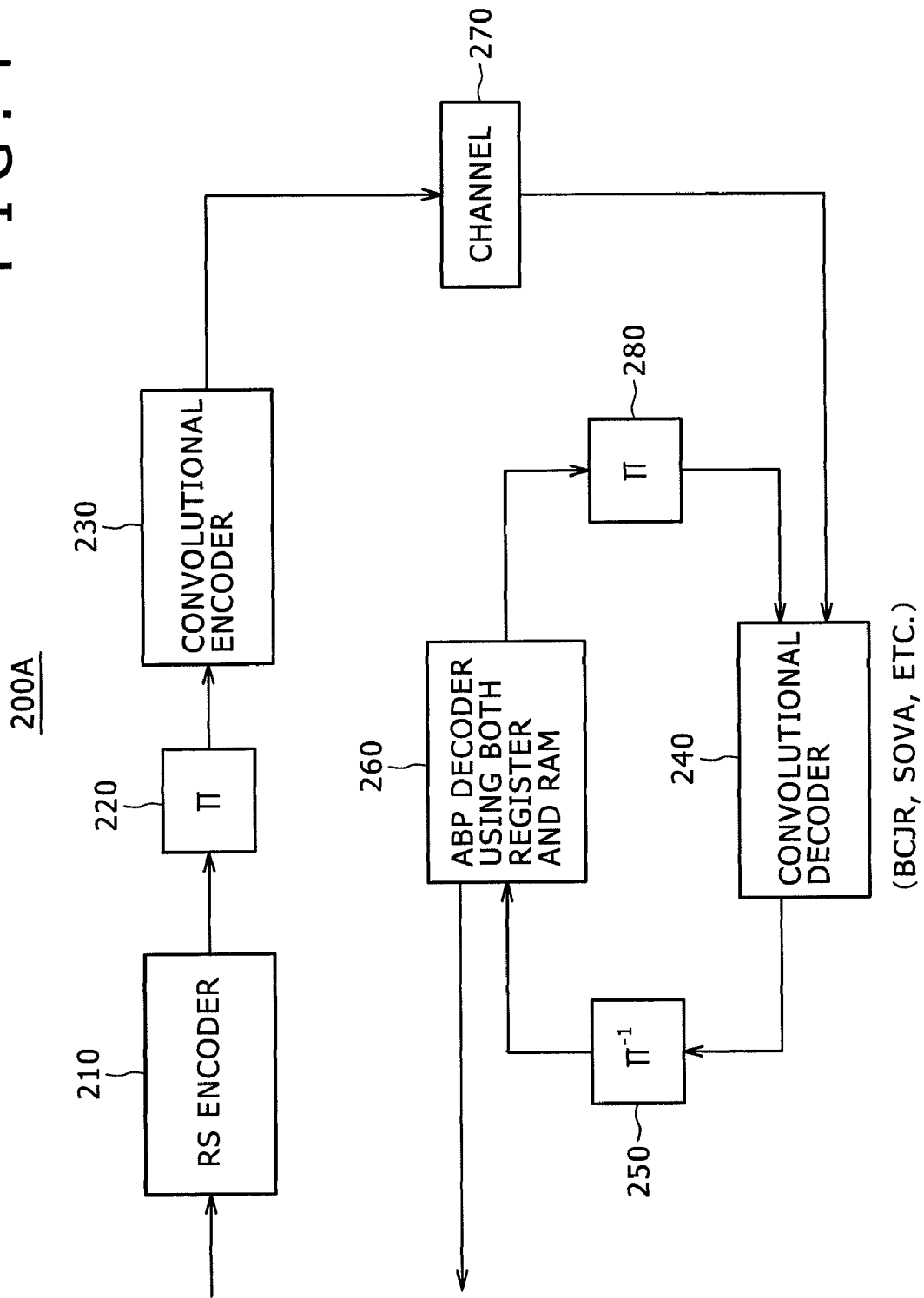
FIG. 4 is a diagram showing an example of configuration of a communication system according to a third embodiment in which an ABP decoder is used in an error correcting system of a digital signal receiver such for example as a digital television set.

FIG. 4 is a diagram showing an example of configuration of a communication system according to a third embodiment in which the ABP decoder is used in an error correcting system of a digital signal receiver (receiving device) such for example as a digital television set.

The communication system 200A according to the third embodiment is different from the communication system 200 according to the second embodiment in that the communication system 200A is configured as a system that subjects a received word to convolutional code soft output decoding and which thereafter performs ABP decoding on the received word repeatedly via an interleaver 280 and a deinterleaver 250, the system having an ABP decoder 260 using both a register and a RAM.

The convolutional code soft output decoding in this case refers to decoding by for example a BCJR algorithm or SOVA.

The communication system 200A having the register according to the third embodiment adopts the ABP decoder that also uses the RAM, so that a circuit scale is greatly reduced.

<Fourth Embodiment>

FIG. 5 is a diagram showing an example of configuration of a digital storage medium reproducer according to a fourth embodiment adopting an ABP decoder using both a register and a RAM.

The digital storage medium reproducer (storage medium reproducing device) 300 includes a DVD player, for example.

The digital storage medium reproducer 300 can process an n-dimensional RS-product-coded transmitted word. The digital storage medium reproducer 300 includes RS encoders 310-1 to 310-$n$ each for an nth dimension, a channel 320, and ABP decoders 330-1 to 330-$n$ each corresponding to an nth dimension and using both a register and a RAM.

An n-dimensional RS-product-coded signal is subjected to hard decision, and thereafter subjected to ABP decoding by the ABP decoders 330-1 to 330-$n$ each corresponding to an nth dimension of the n dimensions and using both a register and a RAM.

The digital storage medium reproducer 300 having the registers according to the fourth embodiment adopts the ABP decoders that also use a RAM, so that a circuit scale is greatly reduced.

<Fifth Embodiment>

FIG. 6 is a diagram showing an example of configuration of a digital storage medium reproducer according to a fifth embodiment adopting an ABP decoder using both a register and a RAM.

The digital storage medium reproducer 300A according to the fifth embodiment is different from the digital storage medium reproducer 300 according to the fourth embodiment in that the digital storage medium reproducer 300A has ABP decoders 331-1 to 331-$n$, . . . , 33$m$-1 to 33$m$-$n$ using both a register and a RAM, the ABP decoders 331-1 to 331-$n$, . . . , 33$m$-1 to 33$m$-$n$ each corresponding to an nth dimension and performing RS list decoding including (m-1)th known information, in addition to ABP decoders 330-1 to 330-$n$ using both a register and a RAM, the ABP decoders 330-1 to 330-$n$ each corresponding to an nth dimension and performing RS list decoding including first known information.

The digital storage medium reproducer 300A according to the fifth embodiment repeatedly subjects a received word to ABP decoding by the ABP decoders using both a register and a RAM for each dimension (m-1) times.

The digital storage medium reproducer 300A having the register according to the fifth embodiment adopts the ABP decoders that also use a RAM, so that a circuit scale is greatly reduced.

Incidentally, the methods described above in detail can also be formed as a program according to the above-described procedure, and executed by a computer such as a CPU or the like.

In addition, such a program can be accessed by a computer in which a recording medium such as a semiconductor memory, a magnetic disk, an optical disk, a floppy (registered trademark) disk, or the like is set, and the program can be executed.

It should be understood by those skilled in the art that various modifications, combinations, sub-combinations and alterations may occur depending on design requirements and other factors insofar as they are within the scope of the appended claims or the equivalents thereof.

What is claimed is:

1. A decoding device for a linear code on a ring R, said decoding device comprising:
   a plurality of storage media including a register and a semiconductor memory; and
   a processing section;
   wherein said processing section uses a part of reliability of all symbols at a previous time to update reliability of each symbol in a process of iterative decoding for increasing the reliability of each symbol, and further retains a part used to update retained reliability information in the register and a part unused to update the retained reliability information in the semiconductor memory.

2. The decoding device according to claim 1,
   wherein said processing section uses belief propagation (BP) as said iterative decoding, and further uses approximation by a UMP (Uniformly Most Powerful) decoding method at a time of a reliability update.

3. The decoding device according to claim 2,
   wherein said processing section obtains reliability of a received word, determines order of priority in diagonalizing a parity check matrix on a basis of the obtained reliability, diagonalizes the parity check matrix on a basis of the determined order of priority, and updates the reliability of the received word by performing belief propagation (BP) one or a plurality of times using a resulting parity check matrix.

4. The decoding device according to claim 1,
   wherein one of an algebraic geometry code on a finite field and an isomorphic code of the algebraic geometry code is used as a linear code.

5. The decoding device according to claim 4, wherein one of a Reed-Solomon code, a Bose-Chaudhuri-Hocquenghem (BCH) code, and isomorphic codes of the Reed-Solomon code and the Bose-Chaudhuri-Hocquenghem (BCH) code is used as an algebraic geometry code, and bounded distance decoding is performed in a subsequent stage with reliability obtained by a plurality of updates as an input received word.

6. A receiving device for receiving a signal transmitted from a device formed by connecting one of a Reed-Solomon (RS) encoder and a Bose-Chaudhuri-Hocquendem (BCH) encoder to a convolutional encoder, said receiving device comprising:
   a decoding device using a reliability update and a decoding method in claim 5.

7. A receiving device for receiving a signal transmitted from a device formed by connecting one of a Reed-Solomon (RS) encoder and a Bose-Chaudhuri-Hocquenghem (BCH) encoder to a convolutional encoder, said receiving device comprising:
   an iterative decoding device using a reliability update and a decoding method in claim 5.

8. A storage medium reproducing device for a signal resulting from n-dimensional product coding using one of a Reed-Solomon (RS) code and a Bose-Chaudhuri-Hocquenghem (BCH) code, said storage medium reproducing device comprising:

a decoding device using a reliability update and a decoding method in claim 5.

9. A storage medium reproducing device for a signal resulting from n-dimensional product coding using one of a Reed-Solomon (RS) code and a Bose-Chaudhuri-Hocquenghem (BCH) code, said storage medium reproducing device comprising:
an iterative decoding device using a reliability update and a decoding method in claim 5.

10. The decoding device according to claim 4,
wherein one of a Reed-Solomon code, a Bose-Chaudhuri-Hocquenghem (BCH) code, and isomorphic codes of the Reed-Solomon code and the Bose-Chaudhuri-Hocquenghem (BCH) code is used as an algebraic geometry code, and hard decision list decoding by a predetermined algorithm is performed with reliability obtained by a plurality of updates as an input received word.

11. A receiving device for receiving a signal transmitted from a device formed by connecting one of a Reed-Solomon (RS) encoder and a Bose-Chaudhuri-Hocquenghem (BCH) encoder to a convolutional encoder, said receiving device comprising:
a decoding device using a reliability update and a decoding method in claim 10.

12. A receiving device for receiving a signal transmitted from a device formed by connecting one of a Reed-Solomon (RS) encoder and a Bose-Chaudhuri-Hocquenghem (BCH) encoder to a convolutional encoder, said receiving device comprising:
an iterative decoding device using a reliability update and a decoding method in claim 10.

13. A storage medium reproducing device for a signal resulting from n-dimensional product coding using one of a Reed-Solomon (RS) code and a Bose-Chaudhuri-Hocquenghem (BCH) code, said storage medium reproducing device comprising:
a decoding device using a reliability update and a decoding method in claim 10.

14. A storage medium reproducing device for a signal resulting from n-dimensional product coding using one of a Reed-Solomon (RS) code and a Bose-Chaudhuri-Hocquenghem (BCH) code, said storage medium reproducing device comprising:
an iterative decoding device using a reliability update and a decoding method in claim 10.

15. The decoding device according to claim 4,
wherein one of a Reed-Solomon code, a Bose-Chaudhuri-Hocquenghem (BCH) code, and isomorphic codes of the Reed-Solomon code and the Bose-Chaudhuri-Hocquenghem (BCH) code is used as an algebraic geometry code, and multiplicity setting and soft decision list decoding by a predetermined algorithm is performed with reliability obtained by a plurality of updates as an input received word.

16. A receiving device for receiving a signal transmitted from a device formed by connecting one of a Reed-Solomon (RS) encoder and a Bose-Chaudhuri-Hocquenghem (BCH) encoder to a convolutional encoder, said receiving device comprising:
a decoding device using a reliability update and a decoding method in claim 15.

17. A receiving device for receiving a signal transmitted from a device formed by connecting one of a Reed-Solomon (RS) encoder and a Bose-Chaudhuri-Hocquenghem (BCH) encoder to a convolutional encoder, said receiving device comprising:
an iterative decoding device using a reliability update and a decoding method in claim 15.

18. A storage medium reproducing device for a signal resulting from n-dimensional product coding using one of a Reed-Solomon (RS) code and a Bose-Chaudhuri-Hocquenghem (BCH) code, said storage medium reproducing device comprising:
a decoding device using a reliability update and a decoding method in claim 15.

19. A storage medium reproducing device for a signal resulting from n-dimensional product coding using one of a Reed-Solomon (RS) code and a Bose-Chaudhuri-Hocquenghem (BCH) code, said storage medium reproducing device comprising:
an iterative decoding device using a reliability update and a decoding method in claim 15.

20. A decoding method for a linear code on a ring R,
wherein a part of reliability of all symbols at a previous time is used to update reliability of each symbol in a process of iterative decoding for increasing the reliability of each symbol, and further a part used to update retained reliability information is retained on a register and a part unused to update the retained reliability information is retained on a semiconductor memory.

21. The decoding method according to claim 20,
wherein belief propagation (BP) is used as said iterative decoding, and further approximation by a UMP (Uniformly Most Powerful) decoding method is used at a time of a reliability update.

22. The decoding method according to claim 21,
wherein reliability of a received word is obtained, order of priority in diagonalizing a parity check matrix is determined on a basis of the obtained reliability, the parity check matrix is diagonalized on a basis of the determined order of priority, and the reliability of the received word is updated by performing belief propagation (BP) one or a plurality of times using a resulting parity check matrix.

* * * * *